(12) United States Patent
Phelan et al.

(10) Patent No.: US 8,179,071 B2
(45) Date of Patent: May 15, 2012

(54) SYSTEM AND METHOD FOR COOLING USING COUNTER-ROTATING FANS

(75) Inventors: Andrew J. Phelan, Magnolia, TX (US); Erik R. Nielsen, Houston, TX (US)

(73) Assignee: Hewlett Packard Development Company, L.P., Houston, TX (US)

( * ) Notice: Subject to any disclaimer, the term of this patent is extended or adjusted under 35 U.S.C. 154(b) by 408 days.

(21) Appl. No.: 12/607,812

(22) Filed: Oct. 28, 2009

(65) Prior Publication Data

US 2011/0095715 A1   Apr. 28, 2011

(51) Int. Cl.
*G05B 5/00*   (2006.01)

(52) U.S. Cl. ......................................... 318/460; 318/471

(58) Field of Classification Search .................. 318/460, 318/471; 388/815; 417/43; 361/685
See application file for complete search history.

(56) References Cited

U.S. PATENT DOCUMENTS

2008/0278905 A1* 11/2008 Artman et al. ................ 361/685

* cited by examiner

*Primary Examiner* — Karen Masih
(74) *Attorney, Agent, or Firm* — Kevin M. Hart

(57) ABSTRACT

A system includes two counter-rotating electric fans. A cooling controller is configured to run the fans at first and second operating points responsive to a measured value of a parameter. The first and second operating points correspond to first and second different required volumes per unit time of air flow. Rotational speeds of the fans at the first and second operating points define first and second different rotational speed offsets.

20 Claims, 4 Drawing Sheets

| ZERO OFFSET OPERATING POINT (INLET PWM/ EXHAUST PWM) | AGGREGATE POWER (WATTS) | NON-ZERO OFFSET OPERATING POINT (INLET PWM/ EXHAUST PWM) | AGGREGATE POWER (WATTS) | POWER SAVINGS (WATTS) | POWER SAVINGS (%) |
|---|---|---|---|---|---|
| 60/60 | 36.19 | 64/50 | 32.14 | 4.05 | 11% |
| 55/55 | 30.93 | 57/49 | 27.99 | 2.94 | 10% |
| 50/50 | 24.72 | 52/44 | 22.87 | 1.85 | 7% |
| 45/45 | 19.23 | 46/42 | 18.39 | 0.84 | 4% |
| 40/40 | 14.48 | 41/37 | 13.93 | 0.55 | 4% |
| 35/35 | 10.13 | 36/32 | 9.94 | 0.19 | 2% |

SYSTEM AND METHOD FOR COOLING USING COUNTER-ROTATING FANS

BACKGROUND

It is known to use an electric counter-rotating fan assembly to cool components in an electronic system. A counter-rotating fan assembly includes two rotors that turn in opposite directions. The blades of the rotors are pitched oppositely so that the two rotors blow air in the same direction even though the fans themselves turn in opposite directions. The axes of the fans are generally parallel with one another in a counter-rotating fan assembly. In most cases, the fans are axially aligned.

DETAILED DESCRIPTION OF THE PREFERRED EMBODIMENTS

The rotational speeds of the two fans in a counter-rotating fan assembly can be set to differ from one another, thus creating a rotational speed offset between the two fans. The inventors hereof have discovered that varying this rotational speed offset at different operating points along the air flow spectrum of the fan assembly can yield desirable results.

Figure 1:
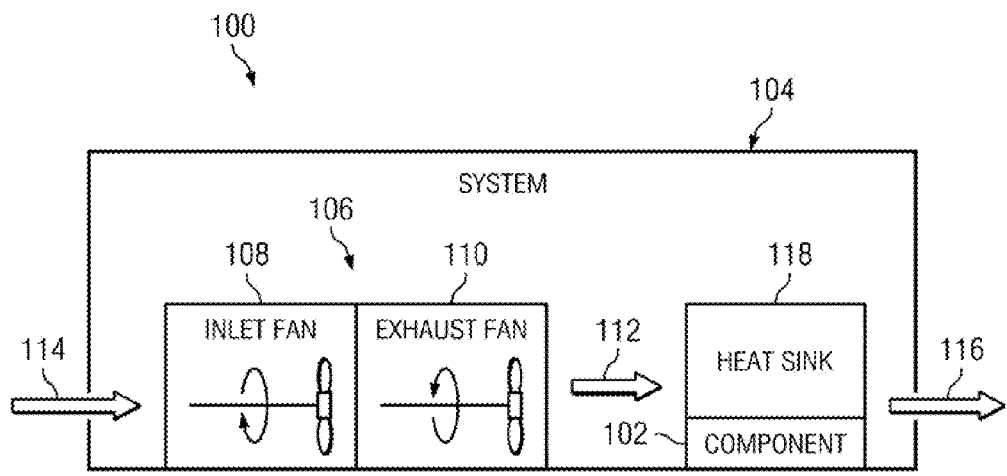
FIG. 1 is a block diagram illustrating a system for cooling a component using counter-rotating fans according to an embodiment of the invention.
Figure 2:
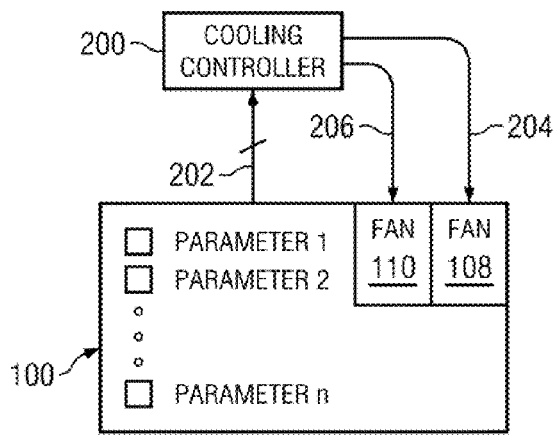
FIG. 2 is a block diagram schematically illustrating a cooling controller for use with the system of FIG. 1 according to one example embodiment of the invention.
Figure 3:
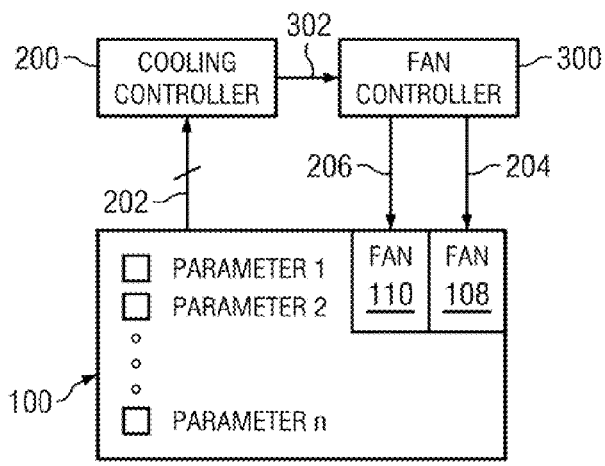
FIG. 3 is a block diagram schematically a cooling controller and a fan controller for use with the system of FIG. 1 according to another example embodiment of the invention.

Accordingly, FIGS. 1-3 illustrate various example embodiments of a system 100 for cooling a component using counter-rotating fans whose rotational speed offsets are varied at different operating points of the fans. In general, a heat-generating component 102 is mounted in an enclosure 104 of system 100 along with a counter-rotating fan assembly 106. Counter-rotating fan assembly 106 includes an inlet electric fan 108 and an exhaust electric fan 110. The rotors of inlet fan 108 and exhaust fan 110 spin in opposite directions. Specifically, either the inlet rotor can spin clockwise and the exhaust rotor counter-clockwise, or vice versa. The axes of the two fans are generally made parallel such that both fans blow air in the same direction 112. In many embodiments, the fans may be axially aligned; but in other embodiments, the axial directions of the fans may differ.

Inlet air may enter enclosure 104 as shown at 114. Exhaust air may exit enclosure 104 as shown at 116. Air moved by fan assembly 106 may be configured to pass around component 102 in order to cool it. A heat sink 118 may be employed to enhance heat transfer between component 102 and the air. Many variations of the number and arrangement of parts shown are possible. For example, duct work may be employed to guide the moving air toward component 102 and to other components in the system. Inlet and outlet ports 114, 116 are not requirements; in some embodiments, the circuit of cooling air may be fully enclosed. Fan assembly 106 and component 102 may be located anywhere in or around enclosure 104.

One example of such a system 100 would be a computing device such as a desktop computer or a server computer. Many other types of systems 100 are possible.

As FIGS. 2 and 3 indicate, various parameters 1-n of system 100 are measurable. Some of those parameters may be temperature-related. For example, it is possible to measure the temperature of component 102 using known techniques and to make the measured temperature available for reading electronically by a cooling controller 200. It is also possible to measure other temperatures within enclosure 104 as well as electric currents and/or other values within the enclosure that may be related to temperature. Any and all of these measured values may be made available as inputs to cooling controller 200 as shown at 202. In response to the measured values, cooling controller 200 may operate fans 108, 110 in order to regulate the temperature of component 102.

In some embodiments, cooling controller 200 may be configured to provide separate control signals to fans 108, 110 as shown in FIG. 2. Each of control signals 204, 206 indicates a desired rotational speed for the respective fan. In other embodiments, a fan controller 300 may be interposed between cooling controller 200 and fans 108, 110 as shown in FIG. 3. In the latter class of embodiments, cooling controller 200 may be configured to provide a single control signal 302 to fan controller 300 to indicate a desired operating point for fans 108, 110. Fan controller 300 may then translate the information on signal 302 into appropriate rotational speeds for fans 108, 110 and may indicate those desired speeds on control signals 204, 206.

Control signals 204, 206, 302 may take any form. For example, any or all of signals 204, 206, 302 may be pulse-width-modulated signals. If so, typically the duty cycle of the signal will be used to indicate a desired operating point or rotational speed.

Figures 4, 5:
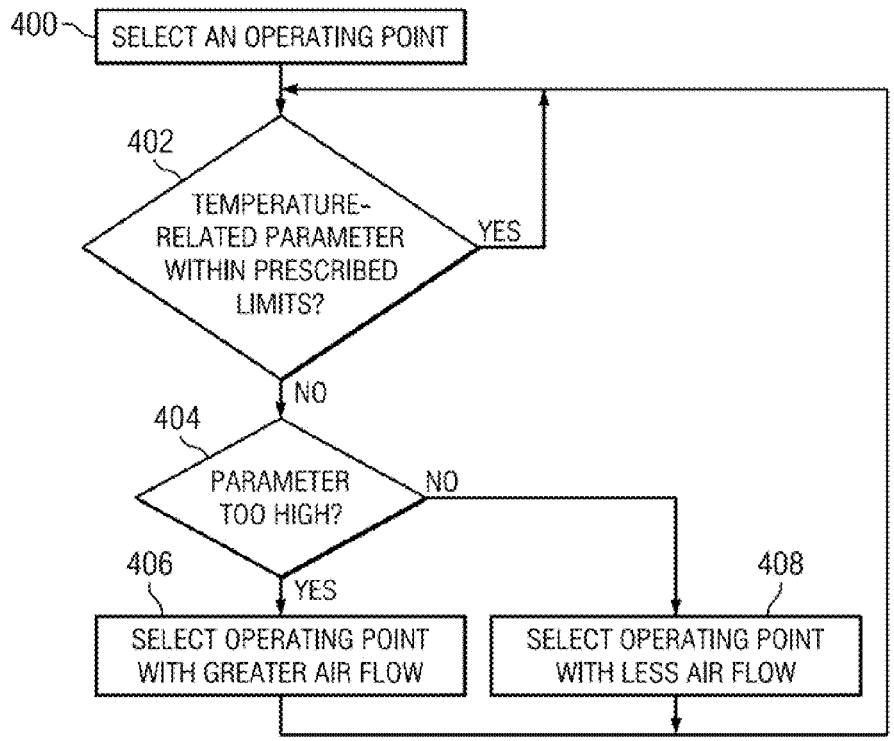
FIG. 4 is a flow diagram illustrating a method for cooling a component according to an embodiment of the invention.
FIG. 5 is a table illustrating power savings achieved in an actual system implemented according to an embodiment of the invention.

Cooling controller 200 is configured to run fans 108, 110 at various different operating points depending on the need for air flow within system 100 to maintain the temperature of component 102 within prescribed limits. Many variations are possible on this basic theme. Generally cooling controller 200 may attempt to select the least volume of air flow per unit time that is sufficient to keep the temperature of component 102 below a threshold temperature beyond which it is undesirable to operate the component. One general example method is illustrated in FIG. 4. Cooling controller 200 may select an initial operating point in step 400. Then as system 100 operates, the temperature of component 102 may vary. If, in step 402, cooling controller 200 detects that the temperature of component 102 or some other temperature-related parameter in system 100 is not within prescribed limits, then it may select a new operating point for fans 108, 110. For example, if the temperature-related parameter indicates a temperature that is too high, then cooling controller 200 may select an operating point corresponding to a greater volume per unit time of air flow as in steps 404, 406. But if the temperature-related parameter indicates a temperature that is below the prescribed limits, then cooling controller 200 may select an operating point corresponding to less volume per unit time of air flow as in step 408.

The number of possible operating points available over which fans 108, 110 may be operated can be large. In some embodiments, the available operating points may be continuous; in other embodiments, they may be discrete. As was mentioned above, however, it is advantageous to vary the rotational speed offset at different operating points along the air flow spectrum of the fans.

By way of example, FIG. 5 illustrates power savings that were achieved with one counter-rotating fan assembly by varying the rotational speed offset of fans 108, 110 at different operating points. Twelve different operating points are shown in the table and compared. The operating points are indicated using the following notation: [rotational speed of inlet fan]/[rotational speed of exhaust fan]. Each rotational speed is indicated as a percentage duty cycle, assuming a pulse-width-modulated control signal. The two operating points compared on each row of the table correspond approximately to the same volume of air flow per unit time.

In general, a rotational speed offset may be stated in terms of the ratio of the rotational speeds of fans 108, 110 or in terms of the difference between their rotational speeds (e.g. inlet rotational speed−exhaust rotational speed). By either measure, the operating points shown in column 500 all have the same rotational speed offset: 1 if stated as a ratio, or 0 if stated as a difference. Aggregate power consumed by fans 108, 110 using these operating points is reported in column 502. Another set of operating points is shown in column 504. The latter operating points are unique in that they do not all share the same rotational speed offset. For example, stated as a difference, the rotational speed offset at operating point 64/50 is 14, while at operating point 36/32 it is 4. Stated as a ratio, the rotational speed offset at operating point 64/50 is 1.28, while at operating point 36/32 it is 1.13.

Column 506 reports the aggregate power consumed by fans 108, 100 using the operating points defined in column 504. As can be seen in columns 508, 510, substantial power savings were achieved on each row. That is, for each volume of air per unit time, power was conserved by choosing a non-zero rotational speed offset. Interestingly, the same technique can be used to reduce other parameters of interest within system 100 such as vibration levels and noise levels.

Figure 6:
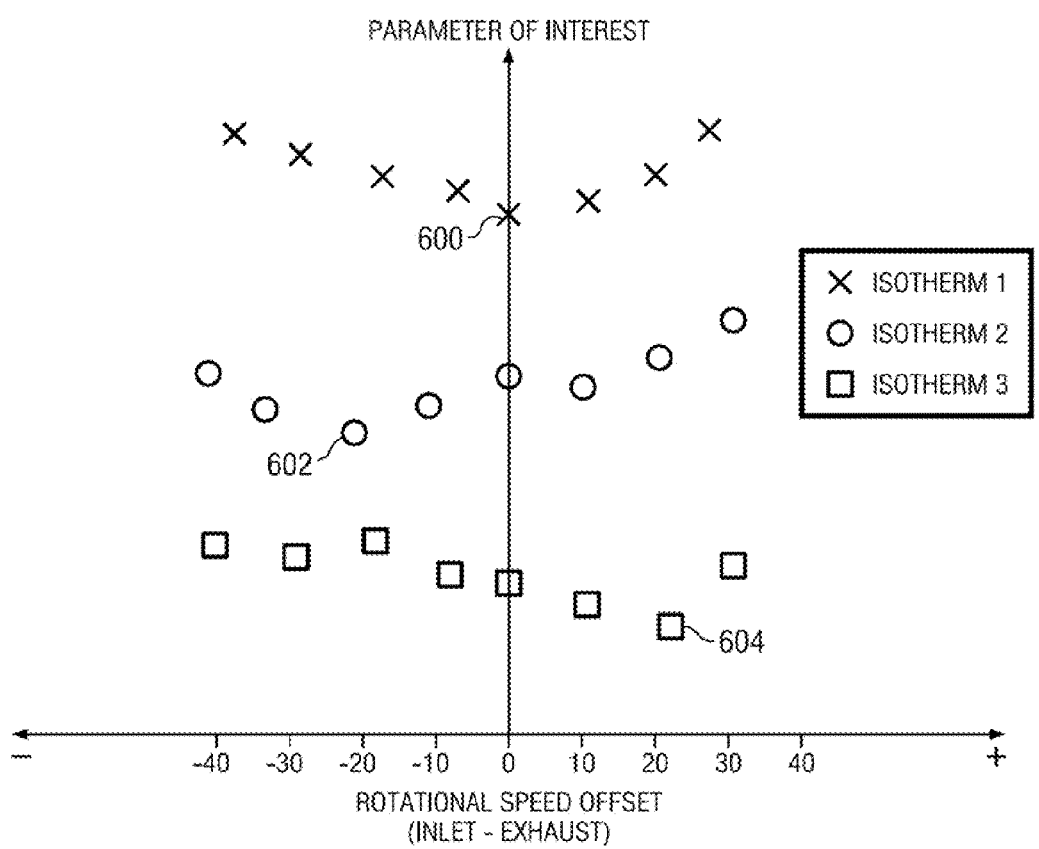
FIG. 6 is a graph illustrating example data points that may be generated to select appropriate operating points for use in an embodiment of the invention.
Figure 7:
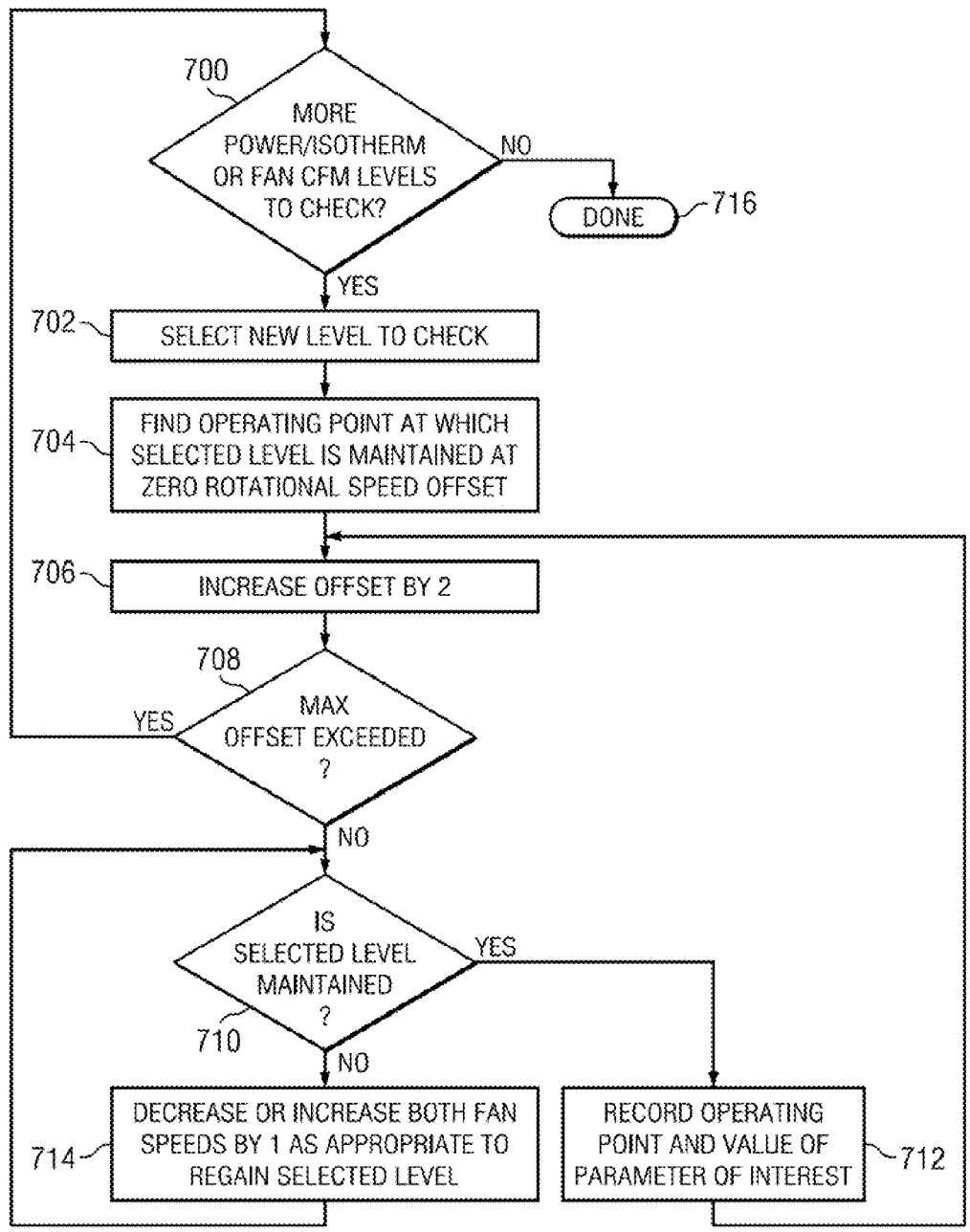
FIG. 7 is a flow diagram illustrating a method for generating data points such as those in FIG. 6.

After an appropriate set of operating points such as those in column 504 have been defined, they may be recorded in any convenient way for use by cooling controller 200 and/or fan controller 300. For example, they may be stored in a lookup table in either controller and used to select rotational speeds of fans 108, 110 given a desired volume of air flow per unit time within system 100:

FIGS. 6 and 7 illustrate a method for defining a set of appropriate operating points such as those in column 504 of the table. In general, the temperature of component 102 may be measured while the component is operated over a range of heat-generating states. For each heat-generating state, fans 108, 110 may be operated over a variety of operating points at which the temperature of component 102 is kept stable. Thus one set of data points may be collected for each of several ranges of air flow volume per unit time. The points within each set so collected will represent an isotherm for component 102, although the various sets may represent different isotherms. In the class of embodiments just described, air flow characteristics of system 100 are taken into account by virtue of the fact that the data points are collected while component 102 and fans 108, 110 are installed in the system.

In another class of embodiments, the data points may be collected outside of system 100 or may be collected using fans 108, 110 alone. In the latter embodiments, each set of data points will simply correspond to a different range of volumes per unit time of air flow generated by fans 108, 100 without regard to any component temperature.

For each of the data points collected, at least two things are recorded: (1) the operating point for fans 108, 110; and (2) the level of some parameter of interest such as the aggregate power being consumed by fans 108, 110, or some amount of vibration being produced, or some amount of noise being generated. In the graph of FIG. 6, the parameter of interest is plotted on the vertical axis, while the rotational speed offset of the fans is recorded on the horizontal axis. Once a set of data points has been collected for each desired range of volume per unit time of air flow, one point from each set may be chosen for inclusion in the lookup table that will be used to control fans 108, 110. In the example of FIG. 6, the one data point in each set having the minimum value for the parameter of interest would be chosen. Thus, data point 600 would be chosen as the appropriate operating point for fans 108, 110 to produce the volume per unit time of air flow corresponding to isotherm 1. Data point 602 would be chosen as the appropriate operating point for fans 108, 110 to produce the volume per unit time of air flow corresponding to isotherm 2. And data point 604 would be chosen as the appropriate operating point for fans 108, 110 to produce the volume per unit time of air flow corresponding to isotherm 3. Each chosen operating point may correspond to a different rotational speed offset, as illustrated.

FIG. 7 illustrates a method for collecting the data points shown in FIG. 6. As was mentioned above, data point sets may be collected at various levels of air flow volume per unit time being moved by fans 108, 110. This may be done implicitly by using various heat-generating states and isotherms for component 102, or may be done explicitly by simply measuring air volume per unit time being moved by fans 108, 110. In steps 700, 702, one such level is chosen for generating a data point set. In step 704, an operating point for fans 108, 110 is found that generates the chosen level while the rotational speeds of both fans are the same. This corresponds to a zero rotational speed offset operating point.

In step 706, the rotational speeds of the fans are changed to create a rotational speed offset. For example, the rotational speed of inlet fan 108 may be increased by one unit and the rotational speed of exhaust fan 110 may be decreased by one unit, creating a rotational offset of two units. Other increments may be used. And any units may be used, such as units of revolutions per minute or units of pulse-width-modulation duty cycle. Moreover, the speed of fan 108 may be decreased while the speed of fan 110 may be increased, instead of the other way around, as appropriate and necessary for exploring the full range of rotational speed offsets available. Once the maximum offset has been exceeded, as for example when one of the fans is at the bottom or top of its speed range, the current set of data points may be closed as indicated at step 708.

After the rotational speed offset has been increased, and after waiting a suitable time for the system to stabilize, a determination is made in step 710 whether the selected level has been maintained. If not, then at step 714 either both fan speeds are increased or both fan speeds are decreased as appropriate for regaining the selected level while maintaining the current rotational speed offset. For example, if measuring component temperature, both fan speeds would be increased if the component temperature were too high. If measuring air flow, both fan speeds would be decreased if the air flow volume per unit time were too high.

If it is determined in step 710 that the level has indeed been maintained at the current offset, then a point is recorded in step 712 and a further offset is attempted at step 706. Once all levels of interest have been explored, the procedure may be terminated as indicated at 716. Various heuristics may be employed to constrain the number of points attempted. For example, further exploration of a data set in one direction of increasing rotational speed offset may be terminated when it appears that values for the parameter of interest will only increase with larger offsets.

While the invention has been described in detail with reference to preferred embodiments thereof, the described embodiments have been presented by way of example and not by way of limitation. It will be understood by those skilled in the art and having reference to this specification that various changes may be made in the form and details of the described embodiments without deviating from the spirit and scope of the invention as defined by the appended claims.

In the appended claims and in the foregoing written description, the words "comprising" and "comprises" are to be read in the open sense to mean "including the following elements but not excluding others."

What is claimed is:

1. A system, comprising:
   first and second counter-rotating electric fans; and
   a cooling controller configured to run the fans at first and second operating points responsive to a measured value of a first parameter, the first and second operating points corresponding to first and second different required volumes per unit time of air flow;
   wherein rotational speeds of the fans at the first and second operating points define first and second different rotational speed offsets.

2. The system of claim 1, wherein:
   at each of the first and second operating points, the rotational speeds and rotational speed offsets of the fans correspond to minimum values of a second parameter at which the fans are able to maintain the required volume per unit time of air flow.

3. The system of claim 2, wherein:
   the second parameter comprises a level of power that is consumed by the fans.

4. The system of claim 2, wherein:
   the second parameter comprises a level of vibration that is caused by the fans.

5. The system of claim 2, wherein:
   the second parameter comprises a level of noise produced by the fans.

6. The system of claim 2, wherein:
   the first parameter comprises a temperature.

7. The system of claim 1, wherein:
   the rotational speeds and rotational speed offsets of the fans at the first and second operating points are predetermined and fixed.

8. The system of claim 1, wherein:
   the rotational speed offsets each comprise a ratio of the rotational speeds of the first and second fans.

9. The system of claim 1, wherein:
   the rotational speed offsets each comprise a difference between the rotational speeds of the first and second fans.

10. The system of claim 1:
    further comprising a fan controller;
    wherein the cooling controller is configured to provide a single signal to the fan controller to indicate a desired one of the first and second operating points; and
    wherein the fan controller is configured to operate the fans, responsive to the single signal, to produce the rotational speeds and rotational speed offset that correspond to the desired operating point.

11. The system of claim 10:
    wherein the single signal is a pulse-width-modulated signal.

12. The system of claim 1:
    wherein the cooling controller is configured to provide a first signal to the first fan and a second signal to the second fan, each of the first and second signals for indicating a desired rotational speed of the corresponding fan; and
    wherein the cooling controller is configured to modulate the first and second signals as necessary to produce the rotational speeds and rotational speed offsets that correspond to the first and second operating points.

13. The system of claim 12:
    wherein the first and second signals are pulse-width-modulated signals.

14. A method of cooling a system using first and second counter-rotating fans, comprising:
    selecting a first operating point corresponding to a first volume of air per unit time to be moved within the system;
    causing the fans to run at the first operating point by running them at first and second rotational speeds defining a first rotational speed offset;
    selecting a second operating point corresponding to a second volume of air per unit time to be moved within the system; and
    causing the fans to run at the second operating point by running them at third and fourth rotational speeds defining a second rotational speed offset different than the first rotational speed offset;
    wherein, for a parameter of interest in the system:
    the first and second rotational speeds and the first rotational speed offset correspond to a minimum value of the parameter at which the fans can maintain the first volume or air per unit time moving within the system; and
    the third and fourth rotational speeds and the second rotational speed offset correspond to a minimum value of the parameter at which the fans can maintain the second volume or air per unit time moving within the system.

15. The method of claim 14, wherein:
    the parameter comprises a level of power consumed by the first and second fans.

16. The method of claim 14, wherein:
    the parameter comprises a level of vibration caused by the first and second fans.

17. The method of claim 14, wherein:
    the parameter comprises a level of noise produced by the first and second fans.

18. The method of claim 14, wherein:
    the first and second rotational speed offsets each comprise a ratio of the rotational speeds of the first and second fans.

19. The method of claim 14, wherein:
    the first and second rotational speed offsets each comprise a difference between the rotational speeds of the first and second fans.

20. A system for cooling a component, comprising:
    a pair of counter-rotating electric fans disposed to blow air past the component; and
    means for operating the fans at first and second rotational speeds, respectively, defining a first operating point and a first rotational speed offset, and for operating the fans at third and fourth rotational speeds, respectively, defining a second operating point and a second rotational speed offset different than the first rotational speed offset;

wherein the first and second operating points correspond to first and second volumes of air per unit time;

wherein the rotational speeds and rotational speed offset at the first operating point correspond to a minimum power level necessary for the fans to move the first volume of air per unit time taking air flow characteristics of the system into consideration; and wherein the rotational speeds and rotational speed offset at the second operating point correspond to a minimum power level necessary for the fans to move the second volume of air per unit time taking air flow characteristics of the system into consideration.

* * * * *